United States Patent [19]

Kurkov

[11] Patent Number: 4,522,745
[45] Date of Patent: Jun. 11, 1985

[54] FUSED 5,6,5-MEMBERED HETEROCYCLIC ELECTROACTIVE POLYMERS

[75] Inventor: Victor P. Kurkov, San Rafael, Calif.

[73] Assignee: Chevron Research Company, San Francisco, Calif.

[21] Appl. No.: 442,394

[22] Filed: Nov. 17, 1982

[51] Int. Cl.³ .............................................. H01B 1/00
[52] U.S. Cl. .................................... 252/500; 252/512; 252/518; 528/183; 528/210; 528/342; 528/363; 528/374
[58] Field of Search .............. 528/183, 210, 342, 374, 528/363; 252/500, 510, 518, 512

[56] References Cited
U.S. PATENT DOCUMENTS 3,966,987  6/1976  Suzuki et al. ..................... 252/500
4,344,869  8/1982  Blinne et al. ..................... 252/500
4,344,870  8/1982  Blinne et al. ..................... 252/500
4,360,644  11/1982 Naarman et al. .................. 252/500
4,375,427  3/1983  Miller et al. ..................... 252/500

Primary Examiner—Lester L. Lee
Attorney, Agent, or Firm—S. R. LaPaglia; T. G. DeJonghe; A. Stephen Zavell

[57] ABSTRACT

A tractable and reversible electroactive polymer which comprises a charged polymer backbone of recurring units of a fused 5,6,5-membered aromatic heterocyclic ring system wherein the 5-membered rings contain at least one nitrogen and a second heteroatom selected from the group consisting of O, S, Se, Te and substituted N, and a sufficient concentration of a charge-compensating ionic dopants associated therewith.

26 Claims, No Drawings

FUSED 5,6,5-MEMBERED HETEROCYCLIC ELECTROACTIVE POLYMERS

BACKGROUND OF THE INVENTION

This invention relates to electroactive organic polymeric materials. More specifically, this invention relates to novel dopant modified heterocyclic electroactive organic polymers.

Recently, research has been conducted into organic polymeric materials in order to modify their room temperature electrical conductivity by reacting them with electron donor acceptor molecules. The electron donor or acceptor molecules, generally known in the art as n- and p-type dopants respectively, can transform the organic polymeric materials so that these modified organic polymeric materials exhibit semiconducting and metallic room temperature electrical conductivity. Polyacetylene is an example of an organic polymeric material whose room temperature electrical conductivity can be modified over several orders of magnitude above its insulator state, by the incorporation of dopant molecules, A. J. Heeger et al, U.S. Pat. No. 4,222,903, said patent incorporated herein by reference. Other examples of organic polymeric materials whose room temperature electrical conductivity can be enhanced by several orders of magnitude over their insulator state by means of incorporation of dopant molecules are poly-p-phenylene, polypyrrole, poly-1,6 heptadiyne, and poly-phenylene vinylene. However, all of the above recited examples are of organic polymeric materials which are completely insoluble or infusable and hence are completely intractable.

Other examples of organic polymers whose room temperature electrical conductivity can be modified with the aid of dopants are polyphenylene sulfide and poly-m-phenylene. However, the above recited materials though being tractable in their original virgin state, undergo irreversible chemistry when reacted with dopants which modify their room temperature electrical conductivity. This irreversible chemistry imparts upon these dopant modified organic polymeric materials a state of intractability. Upon removal of the doping agents, these materials do not revert to the chemical structure which they originally exhibited prior to being modified by the dopants. The inorganic material polysulfur nitride is also considered a polymeric conductor. As with the previously recited polymeric materials, polysulfur nitride is also completely intractable.

For use in a wide variety of electronic device applications, it is highly desirable to have available organic polymeric electrically conducting materials having a preselected room temperature conductivity which can be varied over a broad range. This range should preferably extend from the insulator state of the unmodified organic polymeric material through the semiconducting regime and extending into the highly conducting metallic state. It is also desirable that these organic polymeric electrically conducting materials should be tractable and hence processable so that useful articles of any desired shape and size can be fabricated. Tractable organic polymers are those which can be readily shaped, formed, molded, pressed, cast, etc., into desired articles from the liquid state, i.e. either from the melt, fluid glassy state, or from solution after the completion of the polymerization reaction of the organic polymeric material.

SUMMARY OF THE INVENTION

I have invented an electroactive polymeric material comprising a dopant modified organic polymer whose room temperature electrical conductivity is controlled in a highly selective and reversible manner. Electroactive polymer is defined as a polymer having a conductivity which has been modified with electron acceptor or donor dopants to be greater than the conductivity of the virgin state of the polymer. The electroactive organic polymeric material is fabricated from a virgin polymer, by modifying the polymer with electron donor dopants or electron acceptor dopants. THe virgin polymer is completely tractable and processable and exhibits excellent mechanical and thermal properties as well as being highly stable to oxidative degradation. The electroactive organic polymeric material is comprised of recurring units of a fused 5,6,5-membered nitrogen-containing unsaturated heterocyclic ring system and charge compensating ionic dopants. The recurring units are diradicals. A diradical is defined as a molecule that has two unsatisfied positions available for linking into a polymer chain. The recurring diradicals are directly linked to one another, or may be connected to one another via connecting units. A connecting unit is defined as any atom or group of atoms which can link the diradicals together into a polymer chain. The connecting unit must be conjugated or maintain the pi orbital overlap with the heterocyclic recurring units.

An n-type electroactive organic polymer is obtained by reacting the virgin polymer with reducing or electron donor dopants. Electron donor dopants induce n-type conductivity in the polymer by donating electrons to the polymer and reducing the polymer to a polyanion and the dopant is oxidized to a charge neutralizing cation. Similarly, a p-type electroactive organic polymer is obtained by reacting the virgin polymer with oxidizing electron acceptor dopants. Electron acceptor dopants induce p-type conductivity in the polymer by oxidizing the polymer to a polycation and the dopant is reduced to a charge neutralizing anion.

Alternatively, the polymers can be oxidized or reduced to their electroactive, i.e. conductive, form using electrochemical techniques. In this method, also known as electrochemical doping, the polymer is immersed in a suitable electrolyte solution and used as one electrode of an electrochemical cell. Upon passing an electric current through the cell, the polymer is reduced or oxidized (depending upon the direction of current flow) and charge compensating cationic or anionic dopants from the supporting electrolyte are incorporated into the polymer. For both types of doping, the resulting electroactive polymer consists of a charged polymer backbone incorporating charge compensating ionic dopants. The charges of the polymer and the charge compensating dopants balance so that the electroactive polymer is electrically neutral. The oxidation of reduction proceeds by an electron transfer.

The desired value of the room temperature electrical conductivity of the dopant modified electroactive organic polymer is preselected by controlling the level of incorporation of the dopants into the virgin polymer. Alternatively, the desired value of the room temperature electrical conductivity of the dopant modified electroactive organic polymer is preselected by controlling the length of the reaction time between the virgin polymer and dopants.

The highly selective and reversible modification of the electrical conductivity of the dopant containing organic polymeric material together with the tractability and processability of the virgin polymer is highly desirable in that the fabrication of useful articles and devices such as primary and secondary batteries, and photovoltaic devices. Furthermore, the materials described in this invention can be utilized as active components in such devices and articles as electrochromic displays and photolithographic processes.

DETAILED DESCRIPTION OF THE INVENTION

Electroactive organic polymers are fabricated from the modification of tractable and processable virgin polymers consisting of recurring diradical units of fused 5,6,5 membered nitrogen-containing aromatic, heterocyclic ring system by suitable dopants. The polymers are composed of repeating diradical units derived from fused 5,6,5-membered nitrogen-containing ring systems wherein the heteroatoms are in the five-membered rings. The five-membered rings contain at least one nitrogen atom and a second heteroatom selected from the group consisting of O, S, Se, Te or substituted N. For n-type polymers, acidic proton substituents on the nitrogen atoms cannot be present.

Optionally, the diradicals are separated in the polymer chain by connecting units which can maintain pi orbital overlap with the 5,6,5-membered heterocyclic ring systems. Suitable connecting units are O, S, aryl, substituted aryl, alkenyl, thioalkenyl, thioaryl, diaryl sulfides and the like. Phenylene and biphenylene are preferred connecting units. Of course the connecting units can be the same or different between adjacent recurring units in the polymer chain.

More specifically, the electroactive polymers are fabricated with recurring units comprising positional diradicals derived from fused B 5,6,5-membered heterocyclic rings and mixtures thereof. The ring systems are numbered as follows:

I.

II.

wherein either X or Z and either X' or Z' is N; and the remaining position is selected from O, S, Se, Te, or N—$R_1$. $R_1$ is lower alkyl $C_1$–$C_6$, aryl, cyclo alkyl, and alkoxy. Preferred fused ring systems contain O and N or N—$R_1$ and N or S and N in the 1 or 3 or 7 positions in structure I. O and N or N—$R_1$ and N or S and N in the 1 or 3 and 6 or 8 positions in structure II are preferred. Preferably $R_1$ is phenyl, methyl or methoxy. The $R_1$ excludes H for n-type polymers.

The above structures illustrate nitrogen in the X and X' position. If nitrogen were in the Z or Z' position, then the double bnd would be between the 1 and 2, and 6 and 7 positions for structure I and 2 and 3, and 6 and 7 positions for structure II. Of course, alternating the nitrogens between, for example, X and Z' positions would put the double bonds between 2 and 3, and 6 and 7 for structure I and 1 and 2, and 6 and 7 for structure II.

Suitable examples of nitrogen-containing fused 5,6,5-membered heterocyclic recurring units of structures I and II are diradicals of: 1,7 dialkyl-benzo[1,2-d:4,5-d']dimidazole; 1,7-dimethyl-benzo[1,2-d:4,5-d']dimidazole; benzo[1,2-d:5,4-d']bisthiazole; benzo[1,2-d:4,5-d']bisthiazole; benzo[1,2-d:4,5-d']bisselenazole; benzo[1,2-d:4,5:d']bistellurazole; selenazolo[5,4-f]benzothiazole; 1,8-dialkylbenzo[1,2-d:3,4-d']diimidazole; 1,8-dimethybenzo[1,2-d:3,4-d']diimidazole; benzo[1,2-d:5,4-d']bisoxazole; benzo[1,2-d:4,5-d']bisoxazole; benzo[1,2-d:3,4-d'-bisoxazole; benzo[1,2-d:3,4-d']bisthiazole; their substituted derivatives, and mixtures thereof.

The diradicals can be linked through carbon atoms at the 2,6; 2,4; 2,8; 6,4 and 6,8; in structure I, and at the 2,4; 2,5; 2,7; 5,7; and 7,8 positions in structure II. Connections at the 2,6 position in the polymer is preferred for structure I. Connections at the 2,7 position is preferred for structure II. For example, a preferred structure I recurring unit is a 2,6 diradical illustrated as follows:

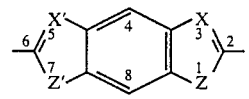

A preferred structure II recurring unit is a 2,5 diradical illustrated as follows:

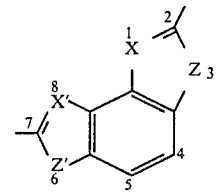

The polymer can be a homopolymer of the diradicals and the substituted derivatives thereof or a copolymer of the diradical units. A homopolymer is defined as a polymer comprising the same recurring diradical unit. A copolymer is defined as a polymer comprising different diradicals. In addition, the polymer is a copolymer if the same or different recurring diradical units are interspersed with connecting units.

Fused 5,6,5-heterocyclic polymers which are precursors to my novel electroactive polymers of the present invention are known in the art and are generally synthesized by condensation polymerization of suitable monomers. Other methods, known in the art, such as nucleophilic displacement of a dihalo-compound with a disodium salt of a dimercapto compound can also be used.

The polymer is rendered electroactive by associating with the virgin polymer a sufficient concentration of an electron donor dopant or an electron acceptor dopant. A sufficient concentration is defined as an amount capable of rendering the polymer more conductive than the virgin state. Preferably, it is that concentration which, when associated with the polymer, effects a significant increase in the conductivity, i.e. on the order of about 10% or greater.

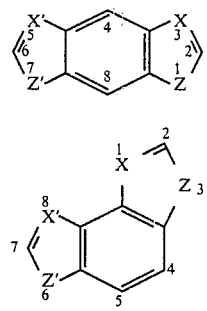

A suitable positively charged compensating dopant can be a cation such as the alkali metal ions, alkali earth metal ions, Group III metal ions, and organic cations such as

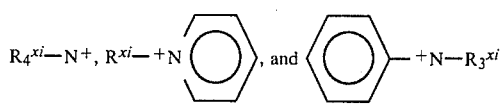

where $R^{xi}$ is a straight- or branched-chain alkyl of $C_1$-$C_6$ groups. Mixtures of these charge-compensating dopants can be employed. These ionic dopants produce n-type conductivity when associated with a reduced or negatively charged polymer.

A suitable negatively charged compensating dopant, i.e. anionic dopants, can be an anion such as the halogen ions, other ions such as $AsF_4^-$, and preferably ions such as $AsF_6^-$, $ClO_4^-$, $PF_6^-$, $SO_3CF_3^-$, $BF_4^-$, $NO_3^-$, $POF_4^-$, $CN^-$, $SiF_5^-$, $SbCl_6^-$, $SbF_6^-$, $HSO_4^-$, organic anions ions such as $CH_3CO_2^-$, (acetate), $C_6H_5CO_2^-$(benzoate), $CH_3C_6H_4SO_3^-$(tosylate), and the like. Mixtures of the charge-compensating dopants can be employed. These ionic dopants produce a p-type conductivity when associated with an oxidized or positively charged polymer polycation.

The electroactive polymers of the invention have the following formula:

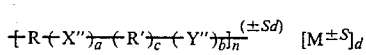

where a is either 0 or 1; b is either 0 or 1; c is either 0 or 1; n is an integer between 1 and 1,000; d is an integer between 1 and 2000; S is an integer 1, 2 or 3; R is either an unsubstituted or substituted fused nitrogen-containing 5,6,5-membered heterocyclic diradical ring system; R' is identical to R or different 5,6,5-membered heterocyclic ring system; X" is a connecting unit comprising of a single atom or a group of atoms; Y" is a connecting unit which is identical to X" or a different atom or group of atoms from X"; and M is an atom or a group of atoms acting as a charge-compensating anionic or cationic dopant whose electrical charge is opposite to the charge exhibited by the recurring units of the polymer backbone:

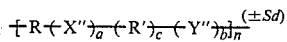

The repeat units form the polyanion or polycation of the electroactive polymer.

The diradical R group is, for example, a substituted or unsubstituted fused 5,6,5-membered nitrogen-containing heterocyclic ring previously defined.

More specifically, R and R' are unsubstituted or substituted diradicals previously recited or mixtures of diradicals which are linked to one another either directly or via the connecting units X" and Y" by forming bridges. Preferably the linkages are formed at the 2,6 position for structure I and the 2,5 position for structure II.

The connecting units X" and Y" can be selected from the group comprising:

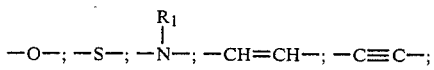

-continued $-CH=CH-CH=CH-$; $-CH=CH-S-CH=CH-$;

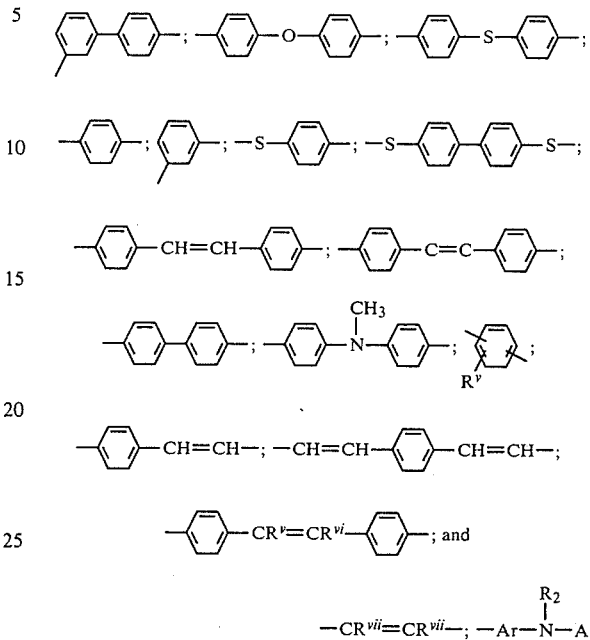

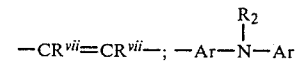

connecting groups are preferred connecting units.

The molecular weight determines the physical properties of the electroactive polymer. Preferably, n is from 5 to 500 or greater. Molecular weights of the polymer should be between 500 and 100,000. A preferred molecular weight is 10,000 or above.

The enhancement in conductivity of the electroactive polymer above the conductivity of polymer in the virgin state is determined by d. The value for d is not greater than 2 n. The conductivity is increased and adjusted by increasing d. Conductivities in the semiconductor region can generally be achieved with d values of about 5 percent the n value.

Preferred electroactive polymers have d adjusted so that the conductivities are greater than about $1\times10^{-10}$ ohm$^{-1}$ cm$^{-1}$, and most preferably greater than $1\times10^{-4}$ ohm$^{-1}$ cm$^{-1}$.

For example, the virgin polymer, poly 2,6-(p-phenylene)-benzo[1,2-d:4,5-d']-bisthiazole, has a conductivity of about $10^{-15}$ ohm$^{-1}$ cm$^{-1}$. The treatment of the polymer with an 0.5M solution of sodium anthracenide (an electron donor) in tetrahydrofuran results in measured conductivity of about $3\times10^{-2}$ ohm$^{-1}$ cm$^{-1}$. Similarly, the virgin polymer poly 2,6-(p-phenylene)-benzo[1,2-d:5,4-d']bisoxazole has a conductivity of about $10^{-15}$ ohm$^{-1}$ cm$^{-1}$. The treatment of the polymer with an 0.5M solution of sodium anthracenide in tetrahydrofuran results in a measured conductivity of about $6 \times 10^{-3}$ ohm$^{-1}$ cm$^{-1}$.

A suitable example of an electroactive —R—X"—R'—Y"— polymer is poly-2,2'-(m-phenylene)-6,6'-(p-phenylene)bibenzo[1,2-d:5,4d']bisoxazole plus a cationic dopant. The polymer has the formula:

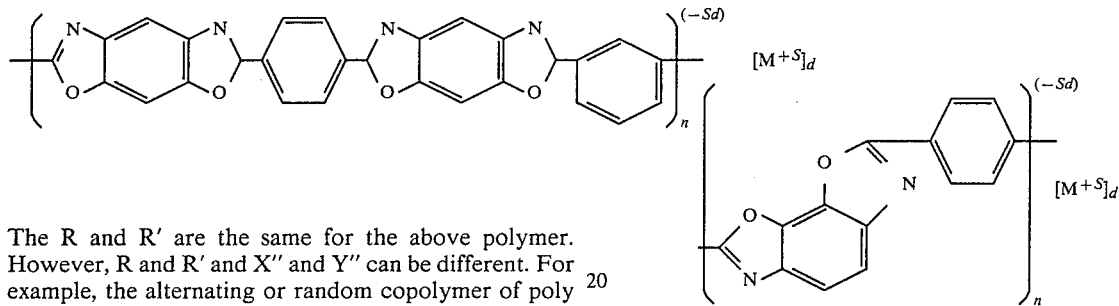

The R and R' are the same for the above polymer. However, R and R' and X" and Y" can be different. For example, the alternating or random copolymer of poly 2,6-(p-phenylene)-benzo[1,2-d:5,4-d']bisoxazole-2,6-(m-phenylene)-benzo[1,2-d:5,4:d']bisthiazole.

When a is 1, and b and c are zero, R' and Y" drop out and the polymer has the following formula:

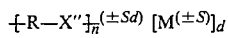

Preferred polymers of the R—X" structure are: Poly2,6-(p-phenylene)-benzo[1,2-d:5,4-d']bisoxazole:

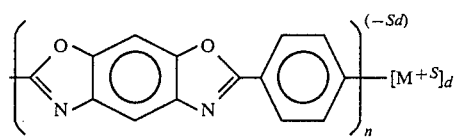

Poly2,6-(m-phenylene)-benzo[1,2-d:5,4-d']bisoxazole:

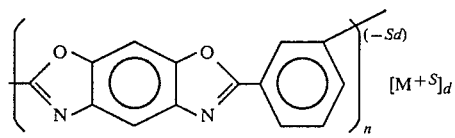

Poly2,6-(p-phenylene)-benzo[1,2-d:4,5-d']bisoxazole:

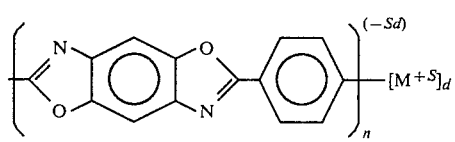

Poly2,7-(p-phenylene)-benzo[1,2-d:3,4-d']bisoxazole:

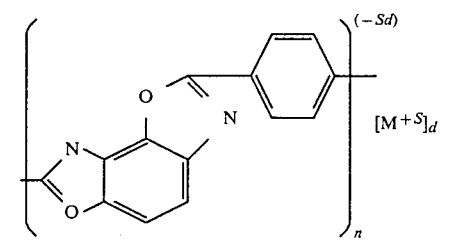

Poly2,7-(p-phenylene)-benzo[1,2-d:6,5-d']bisoxazole:

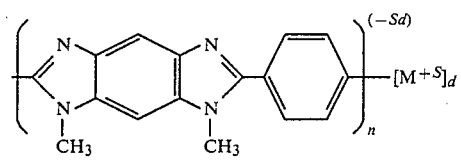

The same structures are preferred for N and S, i.e. benzobisthiazoles, and N and N—R$_1$, i.e. dialkyldimidazoles polymers.

More specifically, the following preferred recurring repeat units occur when a equals 1; b and c equal 0; Z and Z' are N—R$_1$ wherein R$_1$ is methyl; and X and X' are nitrogen; and X" is p-phenyl.

Poly2,6-(p-phenylene)-1,7-dimethyl-benzo[1,2-d:4,5:d']diimidazole

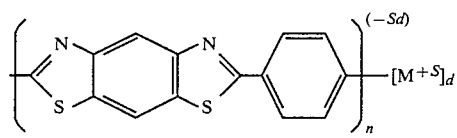

Suitable preferred sulfur-containing recurring units are obtained when a equals 1; b and c are 0; Z and Z' are sulfur; and X and X' are nitrogen; and X" is p-phenylene. More specifically, the recurring units are as follows:

Poly2,6-(p-phenylene)-benzo[1,2-d:5,4-d;]bisthiazole:

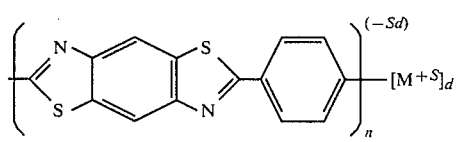

Another preferred sulfur-containing recurring units are disclosed hereinafter. The recurring units occur when a equals 1; b and c equal 0; Z' is S; Z is N; X' is N; X is S; and X" is p-phenylene.

Poly2,6-(p-phenylene)-benzo[1,2-d:4,5-d']bisthiazole:

When a and c are 1 and b is zero, Y" drops out and the polymer has the formula:

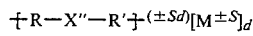

A suitable copolymer occurs when R is the 2,6 diradical of benzo[1,2-d:5,4-d']bisoxazole, X" is p-phenylene, and R' is the 2,6 diradical of benzo[1,2-:d:4,5-d']bisthiazole and the polymer has the formula:

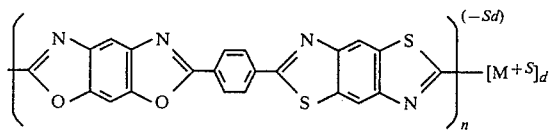

When a, b, and c are zero, R', X", Y" drop out and the polymer is a homopolymer and has the formula:

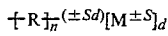

Poly2,6-benzo[1,2-d:5,4-d']bisoxazole

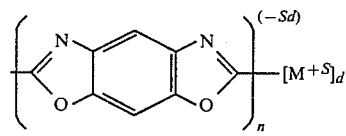

Polymer Fabrication

The starting material for preparing the electroactive polymers of this invention are polymers and copolymers comprising recurring units of fused nitrogen-containing aromatic heterocyclic ring system. Preferably the recurring units are fused 5,6,5-membered heterocycles wherein a nitrogen and another heteroatom are in the 5-membered rings. These polymers and copolymers are well known materials having been synthesized in a variety of ways.

Heterocyclic polymers containing fused 5,6,5 ring systems are most commonly synthesized by polycondensation polymerization of dicarboxylic acids or their derivatives with suitable tetra-functional aromatic monomers. The fused heterocyclic rings are formed in the course of the polymerization reaction. For example, poly-2,6-(m-phenylene)-3,5-dimethyl-diimidazo-benzene can be synthesized according to the procedure of K. Mitsuhashi and C. S. Marvel, L. Polym. Sci., (A), 3, 1661 (1965), completely incorporated herein by reference. The procedure involves melt polycondensation polymerization of 1,3-dimethylamino-4,6-diamino-benzene with diphenyl isophthalate.

Polymers containing 2,6-benzo-bisoxazole units in the main chain can be synthesized by the procedure of J. F. Wolfe and F. B. Arnold, Macromolecules, 14, 909 (1981), completely incorporated herein by reference. According to their procedure, poly2,6-(p-phenylene)-benzo[1,2-d:5,4-d']bisoxazole is prepared by a poly(-phosphoric) acid catalyzed polycondensation polymerization of 4,6-diamino-1,3-benzenediol dihydrochloride with terephthalic acid under a staged temperature regime.

A similar procedure is used for the preparation of polymers with 2,6-benzobisthiazole units described by J. F. Wolfe, B. H. Loo, and F. E. Arnold, Macromolecules, 14, 915 (1981), completely incorporated herein by reference. Thus, poly2,6-(p-phenylene)-benzo[1,2-d:4,5-d']bisthiazole is prepared by a polyphosphoric acid catalyzed poly-condensation reaction of 2,5-diamino-1,4-benzenedithiol dihydrochloride with terephthalic acid. These polymers are tractable and can be processed from acid solutions, and possess good thermal and mechanical properties.

Tractable Polymer Fabrication

Subsequent to polymerization, articles such as fibers, ribbons, or free-standing films are cast from solution. The solution is formed by dissolving the desired polymer in an acidic solvent such as sulfuric acid, formic acid, methane sulfonic or polyphosphoric acid. The solution temperature is from about 25° C. to about 200° C. and preferably from 25°–100° C. The polymers are coagulated into the previously mentioned articles or films in a basic coagulation bath. For free-standing films, the polymers are fabricated from solutions containing about 2 to 25% polymer dissolved in the solvent. At concentrations which exceed 10%, the cast films take on an anisotropic morphology. The anisotropic property enhances the conductivity in the anisotropic direction. An amine, for example triethylamine, dissolved in a protonic solvent such as $H_2O$ and preferably ethyl alcohol comprises the coagulation bath. The bath is maintained at a lower temperature than the dissolution temperature of the polymer in the solvent. Usually room temperature is selected as the operating temperature of the coagulation bath. The fabricated articles are dried. Elevated temperatures, usually 60° C., and reduced pressure accelerated the drying process. Drying is continued until no further weight loss is observed.

Alternatively, films are cast into water, comprising the coagulation bath, followed by neutralization in aqueous bicarbonate. Neutralized films are washed in water and dried at elevated temperatures, 60°–100° C., under reduced pressure.

Polymer Conductivity Modification

After fabrication of the desired articles from the poly-fused heterocyclic polymers by means of the procedure described above, the articles are rendered electroactive by, for example, chemical or electrochemical procedures. The articles can be rendered electroactive in an atmosphere which is inert with respect to the polymer and dopant, by contacting them with suitable dopants. An inert atmosphere is defined as an atmosphere which does not react with the polymer, the dopant, or the electroactive polymer. For example, the atmosphere can be argon, helium, and nitrogen and the like. The inert liquid medium should be able to wet and swell the polymer but not react with it. The doping can also be carried out in an inert liquid medium such as tetrahydrofuran, acetonitrile and the like. The dopants can be oxidants or electron accepting molecules, or reductants or electron donating molecules. Both types of dopants may be in the form of gases or vapors, pure liquids or liquid solutions. Preferably, oxygen and water moisture are excluded during and after the doping process because the conductive polymers tend to degrade, i.e. lose conductivity, when exposed thereto.

For example, the polymer can be contacted with alkali naphthalides or alkali anthracenides such as sodium naphthalide, potassium naphthalide, or sodium anthracenide in a tetrahydrofuran solution. The dopant concentration can be from about 0.001 to about 1 molar and preferably from about 0.01 to about 0.5 molar in THF or other suitable solvent. Alternative doping methods are taught in U.S. Pat. No. 4,204,216 and incorporated herein by reference. An example of an electron acceptor dopant is AsF$_5$.

The electron donor or acceptor dopants reduce or oxidize the polymer and are incorporated as charge compensating ionic dopants. The incorporation of the dopants into the polymer can be observed by a color change in the polymer as well as an enhanced conductivity. For example, a virgin polymer film having a brown color darkened in color upon doping and the measured conductivity increases by many orders of magnitude.

Alternatively, the polymers can be oxidized or reduced to their conductive forms using electrochemical techniques. In this method, herein referred to as electrochemical doping, the polymer is immersed in a suitable electrolyte solution and used as one electrode of an electrochemical cell. Upon passing an electric current through such a cell the polymer becomes reduced (or oxidized, depending upon the direction of current flow) and charge-compensating cations (or anions) from the supporting electrolyte become incorporated into the polymer. This doping also proceeds with the characteristic color change described above. Thus, the polymer can be electrochemically doped with whatever appropriately charged ion is present in the electrolyte solution. Electrolyte solutions are comprised of a salt dissolved in a solvent. Suitable solvents are acetonitrile, tetrahydrofuran, 2-methyl-tetrahydrofuran, propylene carbonate, dimethylformamide, dimethylsulfoxide and the like. Alternative electrolytes are specified in U.S. application Ser. No. 334,509, filed Dec. 28, 1981, entitled "Batteries Fabricated With Electroactive Polymers", and completely incorporated herein by reference. Suitable cations are Li$^+$, Na$^+$, K$^+$, (CH$_3$)$_4$N$^+$, (C$_2$H$_5$)$_4$N$^+$ and (C$_4$H$_9$)$_4$N$^+$. Suitable anions are Cl$^-$, Br$^-$, ClO$_4^-$, BF$_4^-$, and PF$_6^-$. The extent of doping can be easily controlled by adjusting the amount of charge electrochemically injected into the polymer, either by controlling the magnitude of the current used (galvanostatic charging) or by controlling the potential of the polymer electrode with respect to a reference electrode (potentiostatic charging).

The above-described electrochemical doping process is completely reversible. The polymer can be "undoped" and returned to its original, neutral, non-conducting state simply by applying a current opposite in sign to that used for the doping process. Upon complete undoping the color of the polymer reverts back to its original color. Thus, for example, a reduced i.e. n-type conductivity conducting poly2,6-(p-phenylene)-benzo[1,2-d:4,5-d']bisthiazole, polymer can be reoxidized completely to its neutral, non-conducting form, and the charge-compensating cations incorporated during the electrochemical reduction process are expelled from the article during electrochemical re-oxidation.

Having described the methods of fabrication and the basic polyfused heterocyclic systems, the following examples are intended to be illustrative of the invention and not meant to limit the scope thereof. Modification which would be obvious to one of ordinary skill in the art are contemplated to be within the scope of the invention.

EXAMPLES

Example 1

Preparation of Poly2,6-(p,phenylene)-benzo[1,2-d:5,4-d']bisoxazole

Monomer Synthesis

Preparation of 4,6 Diamino-1,3-dihydroxybenzene

Both the monomer and the polymer were prepared according to the procedure of J. F. Wolfe and F. E. Arnold, Macromolecules 14, 909 (1981).

To 50 g (0.45 moles) of resorcanol in 89 ml of pyridine was added dropwise 78.5 g (1 mole) of acetyl chloride. The reaction was stirred at room temperature overnight.

The reaction mixture was poured into 400 ml of water and extracted with ether. After drying over Na$_2$SO$_4$ the product was distilled. B.P. 114°/1 mmHg. 70.3 g (80%) of diacetyl resorcinol was recovered.

70.3 g (0.36 moles) of diacetyl resorcinol was added dropwise to 250 ml of fuming (90%) nitric acid cooled in ice to maintain the temperature at 10° C. The addition took 3 hrs. The reaction mixture was poured into 2.5 l of ice water, forming a white precipitate. The precipitate was filtered off, washed and boiled with 300 ml of 30% hydrochloric acid for one half hour. 1,3-dihydroxy-4,6-dintrobenzene was recrystallized from ethylacetate.

7.81 g (0.039 moles) of 1,3-dihydroxy-4,6-dinitrobenzene in 125 ml of 30% hydrochloric acid and 50 ml of tetrahydrofuran was hydrogenated over 1.2 g of 5% palladium on carbon at 50 psig of hydrogen. After 47 hours, the reaction was diluted with 225 ml of water and acidified with 200 ml of concentrated hydrochloric acid. The precipitated product was recrystallized four times from water-hydrochloric acid system under N$_2$.

| Analysis: | Calculated* | Found |
|---|---|---|
| % C | 33.82 | 33.98 |
| % H | 4.73 | 4.75 |
| % N | 13.15 | 13.16 |

*for C$_6$H$_8$O$_2$H$_2$.2HCl

Polymer Synthesis 1.562 g (7.3459 moles) of 4,6-diamino-1,3-dihydroxybenzene and 1,2258 g (7.3785 mmoles) of terephthalic acid (sublimed) in 128 g of polyphosphoric acid (Aldrich) was stirred mechanically under nitrogen blanket heated as follows:

| room temp. | 2 hrs. | 130° C. | 3 hrs. |
|---|---|---|---|
| 55° C. | 16 hrs. | 150° C. | 3 hrs. |
| 70° C. | 3 hrs. | 170° C. | 3 hrs. |
| 95° C. | 3 hrs. | 185° C. | 3 hrs. |
| | | 200° C. | 16 hrs. |

The polymerization solution became progressively more viscous. The polymer was precipitated in methanol, stirred in concentratred ammonium hydroxide, filtered and washed with water and methanol. It was then continuously extracted with methanol for 16 hrs. and dried in vacuo at 70° C.

| Analysis: | Calculated* | Found |
|---|---|---|
| % C | 71.80 | 67.21 |
| % H | 2.58 | 2.68 |

| Analysis: | Calculated* | Found |
|---|---|---|
| % N | 11.96 | 11.13 |

*for $(C_{14}H_6N_2O_2)_n$ intrinsic velocity, $eta_{int} = 1.7$ dl/g in methane sulfonic acid at 30° C. The polymer had the formula:

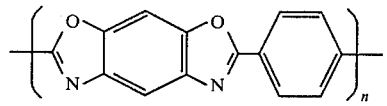

EXAMPLE 2

Preparation of Poly2,6-(p-phenylene)-1,7-dimethyl-benzo[1,2-d:4,5d']diimidazole

Monomer Synthesis

Preparation of 1,3-dimethylamino-4,6-diaminobenzene

The title monomer was synthesized according to the procedure of K. Mitsuhashi and C. S. Marvel, L. Polym. Sci., (A), 3, 1661 (1965).

A 1 1 3-neck flask provided with an addition funnel, reflux condenser, magnetic stirrer and a thermometer was charged wtih 120 ml (257 moles) of nitric acid and 240 ml of sulfuric acid.

38.64 g (0.265 moles) of n-dichlorobenzene was added dropwise over a period of 6 hrs. while cooling the reaction mixture in an ice bath. After the addition was complete, the solution was heated at 70° C. for 70 min. The solution was cooled and poured into 1 l of ice water where the product precipitated as a yellow solid. The product was filtered off and recrystallized from ethanol to give 42.8 g (69% yield) of 1,3-dichloro-4,6-dinitrobenzene. M.P. 106°–108° C.

40 g (0.169 moles) of 1,3-dichloro-4,6-dinitrobenzene in 85 ml of nitrobenzene was heated at 160° C. in a 500 ml 3-neck flask provided with a mechanical stirrer, reflux condenser, and a gas inlet tube just above the liquid. A slow stream of methylamine was passed over the liquid over a period of 6 hrs. The solution was cooled and 84 ml of methanol added. The product was filtered off, washed and recrystallized from dimethylformamide-methanol. 30.8 g (81%) of 1,3-dimethylamino-4,6-dinitrobenzene was recovered. M.P. 329°–330° C.

| Analysis: | Calculated* | Found |
|---|---|---|
| % C | 42.48 | 42.87 |
| % H | 4.46 | 4.49 |
| % N | 24.77 | 25.08 |

*for $C_8H_{10}N_4O_4$ 8 g of 1,3-dimethylamino-4,6-dinitrobenzene was hydrogenated over $PtO_2$ catalyst at 30 psig of hydrogen in acetic acid solvent. After 91 hrs. the product was isolated as the hydrochloride salt. It was recrystallized twice from $H_2O$—HCl.

| Analysis: | Calculated* | Found |
|---|---|---|
| % C | 30.79 | 29.83 |
| % H | 5.81 | 6.00 |
| % N | 17.95 | 17.39 |

*for $C_8H_{18}N_4C_4$

Polymer Synthesis 1.592 g (5.1043 mmoles) of 1,3-dimethyl-amino-4,6-diaminobenzene and 0.8459 g of terephthalic acid (sublimed) in 128 g of polyphosphoric acid (Aldrich) was stirred mechanically under nitrogen blanket and heated as follows:

| | | | |
|---|---|---|---|
| room temp. | 2 hrs. | 130° C. | 3 hrs. |
| 55° C. | 16 hrs. | 150° C. | 3 hrs. |
| 70° C. | 3 hrs. | 170° C. | 3 hrs. |
| 95° C. | 3 hrs. | 185° C. | 3 hrs. |
| | | 200° C. | 16 hrs. |

The polymer was coagulated in water, filtered and washed. It was then neutralized in 5% aqueous sodium bicarbonate solution, filtered, and continuously extracted with methanol.

| Analysis: | Calculated* | Found |
|---|---|---|
| % C | 73.83 | 61.81 |
| % H | 4.65 | 4.77 |
| % N | 21.52 | 16.11 |

*for $C_{16}H_{12}N_4$

The polymer had the formula:

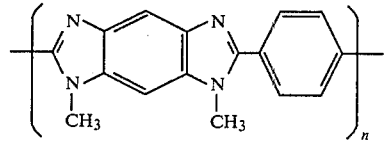

EXAMPLE 3

Preparation of Poly2,6-(p-phenylene)-benzo[1,2-d:4,5-d']bisthiazole

Monomer Synthesis

The requisite monomer and the above polymer were synthesized according to the procedure of J. F. Wolfe, B. H. Loo, and F. E. Arnold, Macromolecules 14, 915 (1981).

51.0 g (0.472 moles) of p-phenylenediamine was added to a solution of 92 ml of concentrated hydrochloric acid with 3.3 g of activated carbon in 420 ml of degassed water. The mixture was warmed to 50° C. and filtered. 145.8 g (1.92 moles) of ammonium thiocynate was added to the filtrate and the solution heated at 100° C. for 15.5 hrs. under a reflux condenser. The light yellow product was filtered off, washed with water and dried in vacuo.

93.5 g (87.5% yield) of p-phenylenedithiourea was obtained. M.P. 256-260.

| Analysis: | Calculated* | Found |
|---|---|---|
| % C | 42.46 | 42.84 |
| % H | 4.45 | 4.39 |

| Analysis: | Calculated* | Found |
|---|---|---|
| % N | 24.76 | 23.95 |

*for $C_8H_{10}N_4S_2$ 147 g (0.92 moles) of bromine in 60 ml of chloroform was added slowly (to keep the temperature ≦50° C.) to a suspension of 90.5 g (0.4 moles) of p-phenylenedithiourea in 420 ml of dry chloroform under $N_2$. The orange slurry was stirred at room temperature for 18 hrs followed by reflux for 24 hrs. After cooling, the product was filtered off and washed with chloroform. The product was stirred in an aqueous sodium bisulfite solution (60 g/450 ml of water) for 6 hrs. It was then filtered, washed with water, and recrystallized from glacial acetic acid.

74.5 g (84%) of 2,6-diamino-benzo[1,2-d:4,5-d']bisthiazole was recovered.

| Analysis: | Calculated* | Found |
|---|---|---|
| % C | 43.23 | 37.81 |
| % H | 2.72 | 2.93 |
| % N | 25.20 | 16.86 |

*for $C_8H_6N_4S_2$ 72 g (0.32 moles) of diaminobenzobisthiazole was added to a solution of 294.3 g of potassium hydroxide in 310 ml of deaerated water under nitrogen. The reaction mixture was stirred mechanically and refluxed for five hrs. It was then cooled in ice, and the light yellow solid collected by filtration in a glove box. The product was suspended in 1 l of 6N hydrochloric acid and then filtered. Recrystallization from hydrochloric acid gave 18.9 g (23%) of 2,5-diamino-1,4-benzenedithiol dihydrochloride.

| Analysis: | Calculated* | Found |
|---|---|---|
| % C | 29.39 | 29.37 |
| % H | 4.11 | 4.17 |
| % N | 11.42 | 11.16 |

*for $C_6H_{10}N_2S_2Cl_2$

Polymer Synthesis 4.9643 g (20.246 mmoles) of 2,5-diamino-1,4-benzenedithiol in 38.5 g of polyphosphoric acid was stirred mechanically under nitrogen at 60° C. for 18 hrs. The temperature was raised to 110° C. and 3.3593 g (20.22 mmoles) of terephthalic acid (sublimed) was added followed by 52 g of polyphosphoric acid. The yellow solution was then heated as follows:

| | |
|---|---|
| 165° C. | 5 hrs. |
| 165° C. | 12 hrs. |
| 180° C. | 12 hrs. |
| 195° C. | 12 hrs. |

The polymer was coagulated in water forming a fiber spindle. Coagulated polymer was filtered off, washed with water, and ground in a Waring blender. It was then neutralized in a 5% aqueous sodium bicarbonate solution, filtered, washed, and dried.

5.4 g (100%) of poly2,6-(p-phenylene)benzo[1,2-d:4,5-d']bisthiazole was obtained.

| Analysis: | Calculated* | Found |
|---|---|---|
| % C | 63.13 | 59.86 |
| % H | 2.27 | 2.40 |
| % N | 10.52 | 10.16 |

*for $(C_{14}H_6N_2S_2)_n$

Eta$_{int.}$ = 2.5 dl/g (in methane sulfonic acid at 30° C. The polymer had the formula:

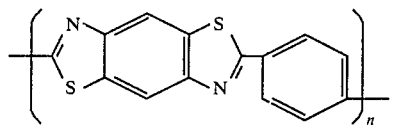

EXAMPLE 4

Preparation of Poly2,6-(m-phenylene)benzo[1,2-d:4,5-d']bisthiazole 3.0353 g (12.379 mmoles) of 2,5-diamino-1,4-benzenedithiol dihydrochloride and 2.0502 g (12.3409 mmoles) of isophthalic acid are polymerized in 70 g of polyphosphoric acid using the same procedure as described in Example 3.

3.16 g (96%) of poly2,6-(m-phenylene)-benzo[1,2-d:4,5-d;]bisthiazole was isolated.

| Analysis: | Calculated* | Found |
|---|---|---|
| % C | 63.13 | 62.09 |
| % H | 2.27 | 2.27 |
| % N | 10.52 | 10.35 |

*for $(C_{14}H_6N_2S_2)_n$

The polymer had the formula:

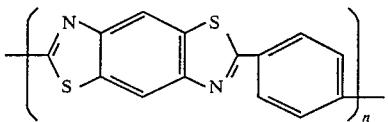

EXAMPLE 5

Preparation of Films and Wires

A 2.5% (wt) solution of poly2,6-(p-phenylene)-benzo[1,2-d:5,4-d']bisoxazole (Example 1) in methanesulfonic acid was prepared by dissolving 0.5 g of polymer in 19.5 g of methanesulfonic acid at room temperature. Thereafter, free standing films were cast from this solution and coagulated in $H_2O$ or a 10% solution of triethylamine in ethanol. Similarly, platinum wires, for electrochemical studies, were coated with the polymer solution and coagulated in the above baths. Following coagulation in water, the films were neutralized in a 5% solution of $NaHCO_3$. Following neutralization, films were thoroughly washed and dried in vacuo at 70° C.

EXAMPLES 6-8

Platinum-coated wires and free-standing films were cast for Examples 2, 3, and 4 in accordance with the procedures outlined in Example 5.

EXAMPLE 9

Chemical Doping of
Poly2,6-(p-phenylene)benzo[1,2-d:4,5-d'bisthiazole

A transparent brown film of the polymer of Example 3 was placed in a jar, in a dry box with a dry argon atmosphere. After 30 minutes, an 0.1N solution of sodium anthracenide in tetrahydrofuran was poured into the jar. The film reacted immediately, changing to a darker color. The doped film conductivity was measured by a standard four point probe conductivity instrument. The four point probe procedure is described in U.S. application Ser. No. 370,231, filed Apr. 22, 1982, entitled "Electroactive Polymers", and incorporated herein by reference. The measured conductivity of the polymer was $3 \times 10^{-2}$ ohm$^{-1}$ cm$^{-1}$. Upon exposure to air, the dark color disappears instantly and the polymer resumes its original color. The infrared spectra of the original undoped film and the air-exposed doped film were the same. The infrared of the dark, doped film was opaqque with no transmittance between 4,000 and 200 cm$^{-1}$, indicating metallic behavior. This experiment shows that the doped polymer films are surprisingly good electrical conductors.

EXAMPLE 10

Electrochemical Doping of the Polymer of Example 1

A 5-inch platinum wire was coated with a thin film of the polymer of Example 1, by dipping the wire into a 2.5% solution of the polymer in methanesulfonic acid. The film-coated wire was coagulated in water, neutralized in 5% sodium bicarbonate solution, washed in H$_2$O, and dried in a vacuum oven at 60° C.

The polymer-coated wire was connected to an E.G. and G. Princeton Applied Research Apparatus comprising a Universal programmer and a Potentiostat/-Galvanostat, with recorder. The polymer-coated end of the wire was then immersed into a 0.1M solution of tetraethylammonium tetrafluoroborate in acetonitrile. A linear potential sweep, varying from 0 to −2.7 volts vs. SCE was applied to the polymer-coated wire. A cathodic current began to flow when the potential reached −1.6 volts, and a cathodic current peak was observed at −2.1 volts. This indicates the uptake of electrons by the polymeric repeat units. At this point, the polymer is negatively charged and contains tetraethylammonium cations as the charge-compensating dopant species. In effect, the polymer was made electroactive by the application of a potential of about −2.1 volts in the presence of an electrolyte solution capable of providing charge-compensating dopant ions. Upon reversing the direction of the potential sweep, an anodic current peak was observed at nearly the same voltage. This indicates reversible removal of the electrons previously injected into the polymer. This procedure returns the polymer to its original uncharged, undoped state.

EXAMPLE 11

Electrochemical Doping of Example 2

A 5-inch platinum wire was coated with a thin film of the polymer of Example 2, by dipping the wire into a 2.5% solution of the polymer in methanesulfonic acid. The film-coated wire was coagulated in water, neutralized in 5% sodium bicarbonate solution, washed in H$_2$O, and dried in a vacuum oven at 60° C.

The polymer-coated wire was connected to an E.G. and G. Princeton Applied Research Apparatus comprising a Universal programmer and a Potentiostat/-Galvanostat, with recorder. The polymer-coated end of the wire was then immersed into a 0.1M solution of tetraethylammonium tetrafluoroborate in acetonitrile. A linear potential sweep, varying from 0 to −2.7 volts vs. SCE was applied to the polymer-coated wire. A cathodic current began to flow when the potential reached −2.1 volts, and a cathodic current peak was observed at −2.3 volts. This indicates the uptake of electrons by the polymeric repeat units. At this point, the polymer is negatively charged and contains tetraethylammonium cations as the charge-compensating dopant species. In effect, the polymer was made electroactive by the application of a potential of about −2.3 volts in the presence of an electrolyte solution capable of providing charge-compensating dopant ions. Upon reversing the direction of the potential sweep, an anodic current peak was observed at nearly the same voltage. This indicates reversible removal of the electrons previously injected into the polymer. This procedure returns the polymer to its original uncharged, undoped state.

EXAMPLE 12

Electrochemical Doping of the Polymer of Example 3

A 5-inch platinum wire was coated with a thin film of the polymer of Example 3, by dipping the wire into a 2.5% solution of the polymer in methanesulfonic acid. The film-coated wire was coagulated in water, neutralized in 5% sodium bicarbonate solution, washed in H$_2$O, and dried in a vacuum oven at 60° C.

The polymer-coated wire was connected to an E. G. and G. Princeton Applied Research Apparatus comprising a Universal programmer and a Potentiostat/-Galvanostat, with recorder. The polymer-coated end of the wire was then immersed into a 0.1M solution of tetraethylammonium tetrafluoroborate in acetonitrile. A linear potential sweep, varying from 0 to −2.7 volts vs. SCE was applied to the polymer-coated wire. A cathodic current began to flow when the potential reached −1.5 volts, and two cathodic current peaks were observed at 01.8 and −2.0 volts. This indicates the sequential uptake of two electrons by the polymeric repeat units. At this point, the polymer is negatively charged and contains tetraethylammonium cations as the charge-compensating dopant species. In effect, the polymer was made electroactive by the application of a potential of about −2.0 volts in the presence of an electrolyte solution capable of providing charge-compensating dopant ions. Upon reversing the direction of the potential sweep, two anodic current peaks were observed at nearly the same voltages. This indicates reversible removal of the two electrons previously injected into the polymer. This procedure returns the polymer to its original uncharged, undoped state.

EXAMPLE 13

Electrochemical Doping and Conductivity Measurement of Free-standing Films of Example 3

A ½" diameter disc of a 1 mil thick film of the polymer of Example 3 was immersed in an electrolyte solution of 0.1M tetraethylammonium tetrafluoroborate and tightly held up against flat gold-coated electrode with a fine nylon mesh screen. This electrode was connected to the same apparatus described in Example 10. As the potential of the gold-coated electrode in contact with the polymer was brought negative of −1.5 volts, the initially pale yellow transparent polymer film became dark and opaque. After holding the potential of the electrode at −2.2 volts vs. SCE for approximately 8 minutes, the film was removed from the electrochemical cell, rinsed with acetonitrile to remove any excess electrolyte solution and allowed to dry in an argon atmosphere. Four point probe conductivity measurement of the resulting electrochemically doped film reveals a conductivity of $2.3 \times 10^{-4}$ ohm$^{-1}$ cm$^{-1}$. In effect, the polymer film was doped to a conductive state by the application of a potential of 02.2 volts in the presence of an electrolyte solution.

EXAMPLE 14

Electrochemical Doping And Conductivity Measurement of the Polymer of Example 4

A one-half inch diameter disc of a 1 mil thick film of the polymer of Example 4 was immersed in an electrolyte solution of 0.1M tetraethylammonium tetrafluoroborate in acetonitrile and tightly held up against a flat gold electrode with a fine nylon screen. This electrode was connected to the same apparatus described in Example 10. The potential of the platinum electrode in contact with the polymer was brought to −2.5 volts vs. SCE and held for 8 minutes. The film was then removed from the electrochemical cell, rinsed with acetonitrile to remove any excess electrolyte solution and allowed to dry in an argon atmosphere. Four-point probe conductivity measurement of the resulting electrochemically doped film revealed a conductivity of $2.3 \times 10^{-4}$ ohm$^{-1}$ cm$^{-1}$. In effect, the polymer film was doped to a conductive state by the application of a potential of −2.5 volts in the presence of an electrolyte solution. This corresponds to reduction of the polymer to an n-type conducting state.

EXAMPLE 15

Chemical Doping of the Polymer of Example 1

The procedure of Example 9 was repeated with the polymer of Example 1. The conductivity was $6 \times 10^{-3}$ ohm$^{-1}$ cm$^{-1}$.

EXAMPLE 16

Chemical Doping of the Polymer of Example 4

The procedure of Example 9 was repeated with the polymer of Example 4. The conductivity was $1.3 \times 10^{-6}$ ohm$^{-1}$ cm$^{-1}$.

EXAMPLE 17

Electrochemical Doping of the Polymer of Example 4

A 5-inch platinum wire was coated with a thin film of the polymer of Example 4, by dipping the wire into a 2.5% solution of the polymer in methanesulfonic acid. The film-coated wire was coagulated in water, neutralized in 5% sodium bicarbonate solution, washed in H$_2$O, and dried in a vacuum oven at 60° C.

The polymer-coated wire was connected to an E. G. and G. Princeton Applied Research Apparatus comprising a Universal programmer and a Potentiostat/-Galvanostat, with recorder. The polymer-coated end of the wire was then immersed into a 0.1M solution of tetraethylammonium tetrafluoroborate in acetonitrile. A linear potential sweep, varying from 0 to −2.7 volts vs. SCE was applied to the polymer-coated wire. A cathodic current began to flow when the potential reached −2.0 volts, and a cathodic current peak was observed at −2.25 volts. This indicates the uptake of electrons by the polymeric repeat units. At this point, the polymer is negatively charged and contains tetraethylammonium cations as the charge-compensating dopant species. In effect, the polymer was made electroactive by the application of a potential of about −2.7 volts in the presence of an electrolyte solution capable of providing charge-compensating dopant ions. Upon reversing the direction of the potential sweep, an anodic current peak was observed at nearly the same voltage. This indicates reversible removal of the electrons previously injected into the polymer. This procedure returns the polymer to its original uncharged, undoped state.

What is claimed is:

1. An electroactive polymer which comprises a charged polymer backbone of recurring units of a fused 5,6,5-membered aromatic heterocyclic ring system wherein the 5-membered rings contain at least one nitrogen and a second heteroatom selected from the group consisting of O, S, Se, Te, and substituted N, wherein the substituent is selected from the group consisting of lower alkyl C$_1$-C$_6$, aryl, cycloalkyl, and alkoxy, and a sufficient concentration of a charge-compensating ionic dopant associated therewith, wherein the polymer backbone is capable of undergoing reversible oxidation or reversible reduction or both to form the charged polymer backbone.

2. The electroactive polymer according to claim 1 wherein the recurring units are selected from the group consisting of 1,7 N-alkyl-benzo[1,2-d:4,5-d′]dimiidazole; 1,7-dimethyl-benzo[1,2-d:4,5-d′] diimidazole; benzo[1,2-d:5,4-d′]bisthiazole; benzo[1,2-d:4,5-d′]bisthiazole; benzo[1,2-d:4,5-d′] bisselenazole; selenazolo[5,4-f]benzothiazole; 1,8-dialkyl-benzo[1,2-d:3,4-d′]diimidazole; 1,8-dimethyl-benzo[1,2-d:3,4-d′]diimidazole; benzo[1,2-d:5,4-d′]bisoxazole; benzo[1,2-d:4,5-d′] bisoxazole; benzo[1,2-d:3,4-d′]-bisoxazole; benzo[1,2-d:3,4-d′] bisthiazole; benzo[1,2-d:4,3-d′]bisthiazole; and mixtures thereof.

3. The electroactive polymer according to claim 2 wherein the charge-compensating ionic dopant is a cation selected from the group consisting of the alkali metal ions, alkali earth metal ions, Group III metal ions,

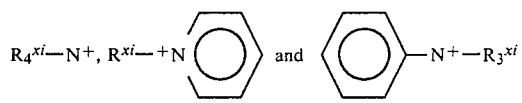

wherein R$^{xi}$ is a straight- or branched-chain alkyl of C$_1$-C$_6$ groups, or mixtures of said cations.

4. The electroactive polymer according to claim 3 wherein the recurring units are N-dialkyl benzodiimidazoles.

5. The electroactive polymer according to claim 3 wherein the recurring units are benzobisoxazoles.

6. The electroactive polymer according to claim 3 wherein the recurring units are benzobisthiazoles.

7. The electroactive polymer according to claim 2 wherein the fused 5,6,5-membered recurring units are interspersed with connecting units selected from the group consisting of phenylene, biphenylene, —CH=CH—, and mixtures thereof.

8. The electroactive polymer according to claim 7 wherein the recurring units are N-dialkyl benzodiimidazoles.

9. The electroactive polymer according to claim 7 wherein the recurring units are benzobisoxazoles.

10. The electroactive polymer according to claim 7 wherein the recurring units are benzobisthiazoles.

11. The electroactive polymer according to claim 1 wherein the charge-compensating ionic dopant is an anion selected from the group consisting of $AsF_4^-$, $AsF_6^-$, $ClO_4^-$, $PF_6^-$, $SO_3CF_3^-$, $BF_4^-$, $NO_3^-$, $POF_4^-$, $CN^-$, $SiF_5^-$, $SbCl_6^-$, $SbF_6^-$, $HSO_4^-$, acetate, benzoate, tosylate, or mixtures thereof.

12. An electroactive polymer which comprises a charged polymer backbone and charge-compensating ionic dopants associated therewith of the formula:

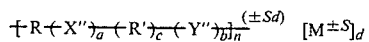

wherein a is 0 or 1; b is 0 or 1; c is 0 or 1; n is an integer from 1 to 1,000; d is an integer from 1 to 2,000; s is an integer 1, 2, or 3; R is a fused nitrogen-containing 5,6,5-membered unsaturated diradical-heterocyclic ring system; R' is the same as R or a different fused nitrogen-containing 5,6,5-membered unsaturated diradical heterocyclic ring system; X" is a connecting unit; Y" is the same connecting unit as X" or a different connecting unit; and M is a charge-compensating ionic dopant of opposite electrical charge to the charge of the polymer backbone, wherein said X" or Y" connecting unit is selected from the group consisting of:

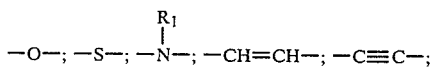

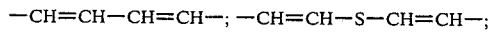

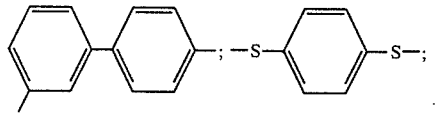

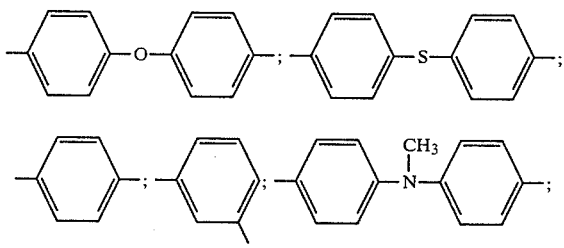

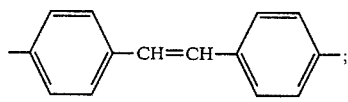

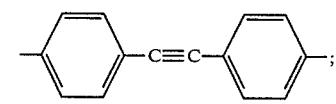

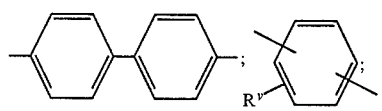

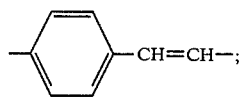

-continued

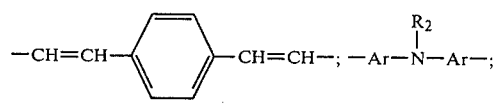

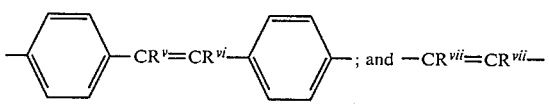

wherein $R_1$ is selected from the group consisting of lower alkyl $C_1$-$C_6$, aryl, cyclo alkyl, and alkoxy, and $R^v$, $R^{vi}$ and $R^{vii}$ are H, methyl, methoxy, halogen and mixtures thereof; Ar is phenylene or biphenylene, and $R_2$ is lower alkyl $C_1$-$C_4$.

13. The electroactive polymer according to claim 12 wherein R and R' are 2,7 diradicals of the formula:

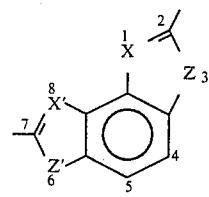

wherein X and X' positions or Z and Z' positions are N, and the other position is selected from the group consisting of O, S, Se, Te, or N—$R_1$, wherein $R_1$ is lower alkyl $C_1$-$C_6$, aryl, cyclo alkyl and alkoxy.

14. The electroactive polymer according to claim 13 wherein R and R' are 2,7 diradicals of the formula:

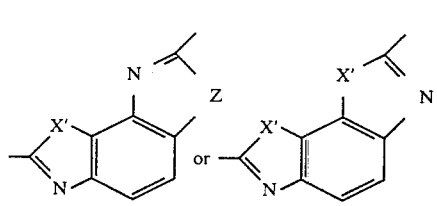

wherein X, X' and Z are selected from the group consisting of O, S, Se, Te, and N—$R_1$ wherein $R_1$ is lower alkyl $C_1$-$C_6$, aryl, cycloalkyl, and alkoxy.

15. The electroactive polymer according to claim 12 wherein R and R' are 2,6 diradicals of the formula:

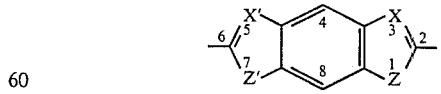

wherein X and X' positions or Z and Z' positions are N, and the other position is selected from the group consisting of O, S, Se, Te, or N—$R_1$, wherein $R_1$ is lower alkyl $C_1$-$C_6$, aryl, cyclo alkyl and alkoxy.

16. The electroactive polymer according to claim 15 wherein R and R' are 2,6 diradicals of the formula:

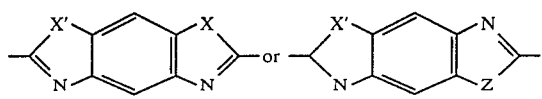

wherein X, X' and Z are selected from the group consisting of O, S, Se, Te, and N—R$_1$, wherein R$_1$ is lower alkyl C$_1$-C$_6$, aryl, cycloaryl and alkoxy.

17. The electroactive polymer according to claim 16 wherein a is 1, b and c are zero, and the polymer has the formula:

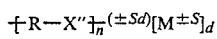

18. The electroactive polymer according to claim 17 wherein the charge-compensating ionic dopant M is a cation selected from the group consisting of the alkali metal ions, alkali earth metal ions, Group III metal ions, and

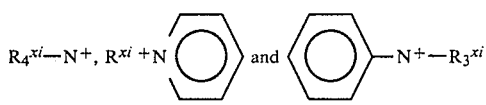

wherein R$^{xi}$ is a straight- or branched-chain alkyl of C$_1$-C$_6$ groups, or mixtures of said cations.

19. The electroactive polymer according to claim 18 wherein the polymer has the formula:

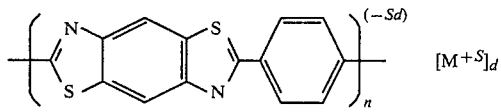

20. The electroactive polymer according to claim 18 wherein the polymer has the formula:

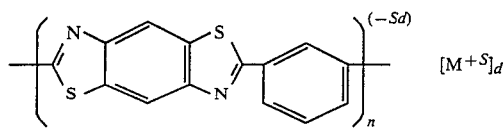

21. The electroactive polymer according to claim 18 wherein the polymer has the formula:

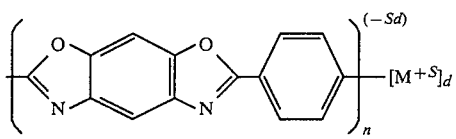

22. The electroactive polymer according to claim 18 wherein the polymer has the formula:

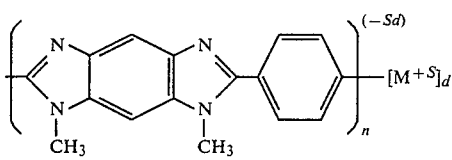

23. The electroactive polymer according to claim 1 wherein a, b and c are zero, and the polymer has the formula:

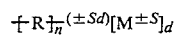

24. The electroactive polymer according to claim 23 where the polymer is poly2,6 benzo[1,2-d:5,4-d']bisoxazole plus an anionic charge compensating dopant.

25. The electroactive polymer according to claim 1 wherein the polymer has a molecular weight of between about 500 and 100,000.

26. The electroactive polymer according to claim 17 wherein n is from 5 to equal to or less than 1,000.

* * * * *

UNITED STATES PATENT AND TRADEMARK OFFICE
CERTIFICATE OF CORRECTION

PATENT NO. : 4,522,745
DATED : June 11, 1985
INVENTOR(S) : VICTOR P. KURKOV

It is certified that error appears in the above-identified patent and that said Letters Patent are hereby corrected as shown below:

Claim 23, line 1, "according to Claim 1", should read

--according to Claim 16--.

Signed and Sealed this

Third Day of December 1985

[SEAL]

Attest:

DONALD J. QUIGG

Attesting Officer

Commissioner of Patents and Trademarks

UNITED STATES PATENT AND TRADEMARK OFFICE
CERTIFICATE OF CORRECTION

PATENT NO. : 4,522,745
DATED : June 11, 1985
INVENTOR(S) : VICTOR P. KURKOV

It is certified that error appears in the above-identified patent and that said Letters Patent are hereby corrected as shown below:

Col. 16, lines 40-45

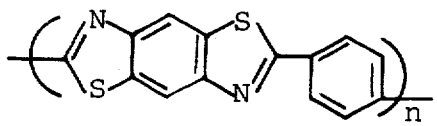

should be

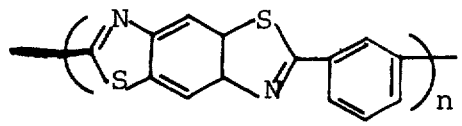

UNITED STATES PATENT AND TRADEMARK OFFICE
CERTIFICATE OF CORRECTION

PATENT NO. : 4,522,745
DATED : June 11, 1985
INVENTOR(S) : VICTOR P. KURKOV

It is certified that error appears in the above-identified patent and that said Letters Patent is hereby corrected as shown below:

Col. 7, line 10

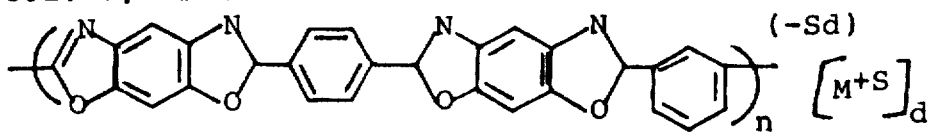

should be

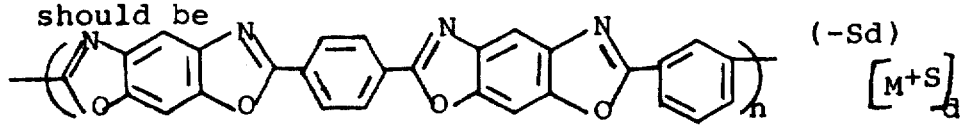

Col. 3, line 59, "and 5" was left out between "3" and "or".

Col. 3, line 66, "bnd" should be "bond"

Signed and Sealed this

Eleventh Day of February 1986

[SEAL]

Attest:

DONALD J. QUIGG

Attesting Officer

Commissioner of Patents and Trademarks